United States Patent [19]
Honjo

[11] Patent Number: 5,404,581
[45] Date of Patent: Apr. 4, 1995

[54] MICROWAVE . MILLIMETER WAVE TRANSMITTING AND RECEIVING MODULE

[75] Inventor: Kazuhiko Honjo, Tokyo, Japan

[73] Assignee: NEC Corporation, Tokyo, Japan

[21] Appl. No.: 917,240

[22] Filed: Jul. 23, 1992

[30] Foreign Application Priority Data

Jul. 25, 1991 [JP] Japan .................. 3-186159

[51] Int. Cl.[6] ................... H04B 1/38; H01L 25/00
[52] U.S. Cl. .................... 455/90; 257/200; 257/275; 257/778
[58] Field of Search .......... 455/73, 90; 257/528, 257/698, 777, 920, 200, 275, 664, 778

[56] References Cited

U.S. PATENT DOCUMENTS 5,191,405  3/1993  Tomita et al. ............ 257/777

OTHER PUBLICATIONS

R. J. Mailloux, "Phased Array Architecture for mm--Wave Active Arrays", *Microwave Journal*, Jul. 1986, pp. 117-124.

*Primary Examiner*—Reinhard J. Eisenzopf
*Assistant Examiner*—Andrew Faile
*Attorney, Agent, or Firm*—Sughrue, Mion, Zinn, Macpeak & Seas

[57] ABSTRACT

On a main plane of a semi-insulation GaAs substrate, a microwave.millimeter wave active circuit is provided, and, on a back surface thereof, a microstrip antenna is provided. On the other hand, a signal processing circuit of a large integration scale is provided on a main plane of a silicon substrate. The microwave.millimeter wave transmitting and receiving module is composed of the semi-insulation GaAs substrate and the silicon substrate which are in contact on the main planes with each other.

8 Claims, 4 Drawing Sheets 5,404,581

MICROWAVE . MILLIMETER WAVE TRANSMITTING AND RECEIVING MODULE

FIELD OF THE INVENTION

This invention relates to a semiconductor device, and more particularly to, a microwave.millimeter wave transmitting and receiving module utilizing a compound semiconductor and a silicon semiconductor.

BACKGROUND OF THE INVENTION

The recent development of compound semiconductors has been remarkable, and the research and development for monolithic devices and apparatuses including not only microwave.millimeter wave laser devices, and transmitters and receivers for communication, but also antenna been intensively carried out. A elements have been intensively carried out. A conventional monolithic module is described on page 119 of "Microwave Journal, July 1986".

One type of a microwave antenna module comprises a semi-insulation GaAs substrate provided on a ground metal plate, and an active circuit including a low noise amplifier, a mixer, a switch, a transmitting amplifier, a phase shifter, an analog to digital (A/D) converter, etc., and a microstrip dipole antenna, respectively, provided on the semi-insulation GaAs substrate.

In this microwave antenna module, circuits of high integration (1 k gates to 10 k gates) such as the A/D converter, etc., and circuits of low integration (several transistors) are fabricated in the common semi-insulation GaAs substrate.

According to the conventional microwave antenna module, however, there is a disadvantage in that fabrication cost is largely increased, because faults tend to occur in the high integration circuits, much more commonly than in the low integration circuits. As a result, a module it is often determined to be faulty as a whole, despite having fully operational low integration circuits, thereby lowering fabrication yield.

On the other hand , a circuit of a high integration scale can be fabricated with high yield by using a silicon semiconductor. However , a microwave.millimeter wave passive circuit including a microstripline, an antennae element, etc. can not be integrated, because no semi-insulation substrate is available thereon.

SUMMARY OF THE INVENTION

Accordingly, it is an object of the invention to provide a microwave.millimeter wave transmitting and receiving module which is fabricated with high fabrication yield.

It is a further object of the invention to provide a microwave in millimeter wave transmitting and receiving module which active and passive circuits are integrated.

According to the invention, a microwave.millimeter wave transmitting and receiving module, comprises:

a first semiconductor chip comprising a microwave.millimeter wave circuit provided on a first plane of a semi-insulation compound semiconductor substrate, and a ground metal film provided on a second plane of the semi-insulation compound semiconductor substrate, the microwave.millimeter wave circuit comprising compound semiconductor active and passive devices; and a second semiconductor chip comprising a signal processing circuit provided on a first plane of a silicon substrate;

wherein the first and second semiconductor chips are in contact on the first planes with each other.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
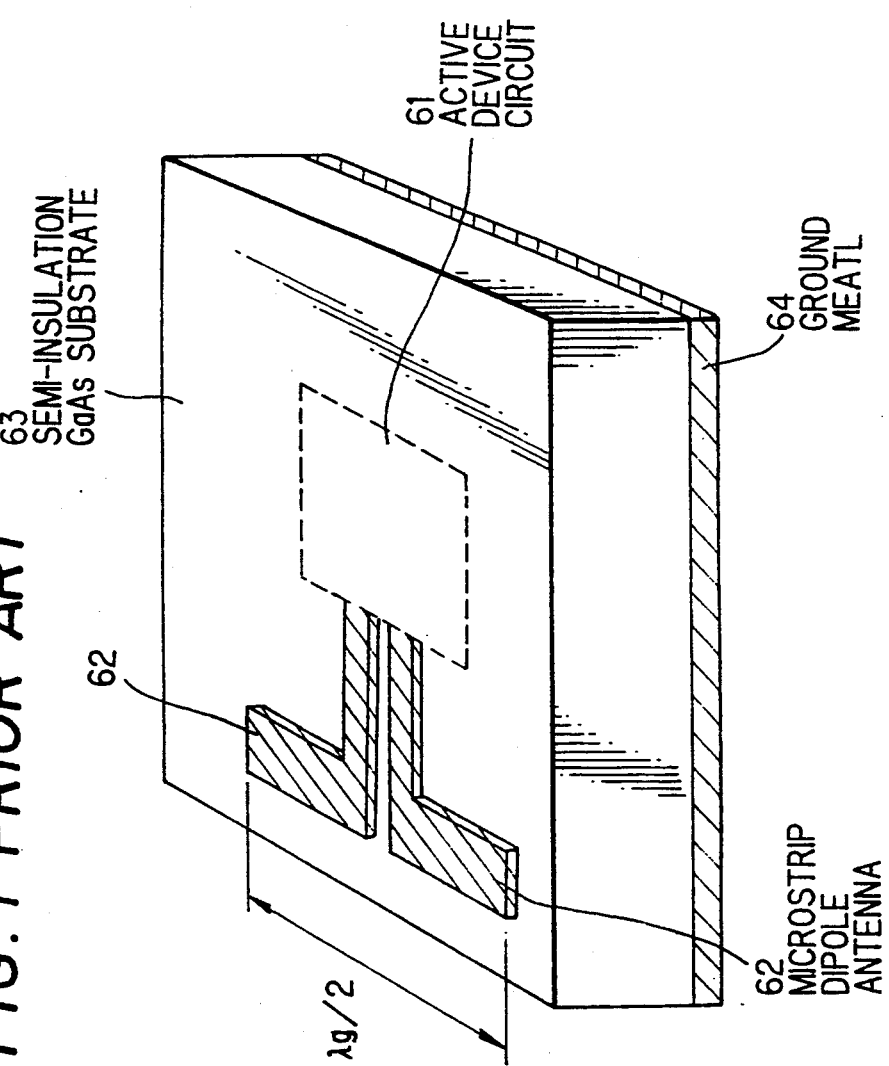
FIG. 1 is a perspective view showing a conventional microwave antenna module.

Before describing a microwave.millimeter wave transmitting and receiving module of a preferred embodiments according to the invention , the aforementioned conventional microwave antenna module will be explained in FIG. 1.

The conventional microwave antenna module comprises a semi-insulation GaAs substrate 63 and a ground metal plate 64 provided on the back surface of the semi-insulation GaAs substrate 63. On the surface of the semi-insulation GaAs substrate 63, an active circuit 61 and a microstrip dipole antenna 62 are provided. The active circuit 61 comprises a low noise amplifier, a mixer, a switch, a transmitting amplifier, a phase shifter, an A/D converter, etc., and a dimension of a radiating portion of the microstrip dipole antenna 61 is set to be "$\lambda g/2$" as shown in FIG. 1, where $\lambda g$ is a wavelength of transmitting and receiving signals.

Figure 2:
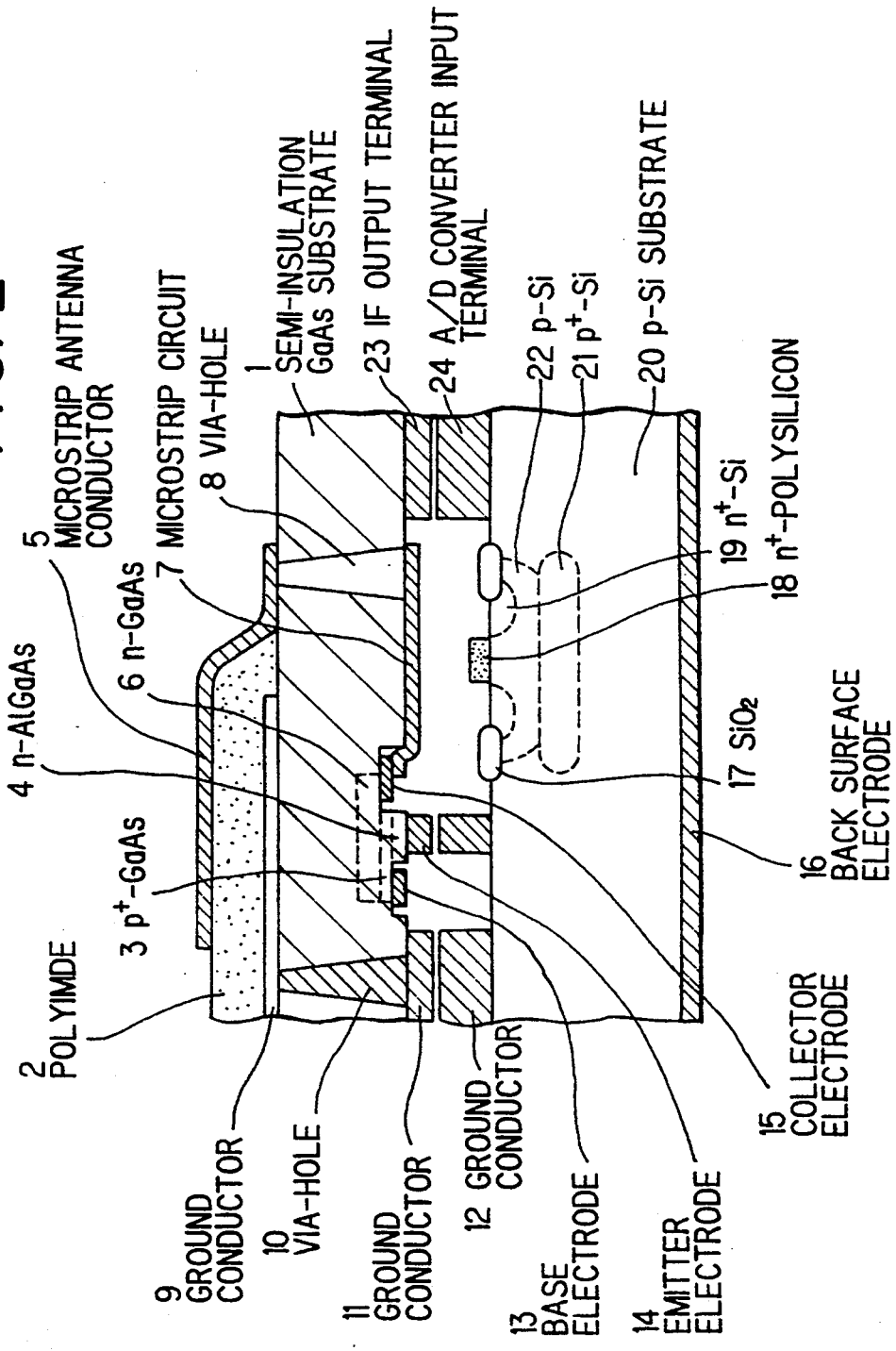
FIG. 2 is a cross-sectional view showing a microwave.millimeter wave transmitting and receiving module of a preferred embodiment according to the invention.

Next, a microwave.millimeter wave transmitting and receiving module of a preferred embodiment according to the invention will be explained in FIG. 2.

The microwave.millimeter wave transmitting and receiving module comprises a semi-insulation GaAs substrate 1 and a p-Si substrate 20. On the main plane of the semi-insulation GaAs substrate 1, a heterojunction bipolar transistor comprising an n-Al GaAs 4 for an emitter layer, a $p^+$ —GaAs 3 for a base layer, and an n-GaAs 6 for a collector layer is provided along with a base electrode 13, an emitter electrode 14, and a collector electrode 15. In addition, a microstrip circuit 7 and a ground conductor 11 is provided thereon, wherein the microstrip circuit 7 is connected through a via-hole 8 to a microstrip antenna conductor 5 provided on the back surface of the semi-insulation GaAs substrate 1, and the ground conductor 11 is connected through a via-hole 10 to a ground conductor 9 also provided on the back surface thereof. Between the microstrip antenna conductor 5 and the ground conductor 9, a polyimide layer 2 is provided, and an intermediate frequency output terminal 23 is also provided on the main plane of the semi-insulation GaAs substrate 1.

On the main plane of the p-Si substrate 20, an n-MOS transistor comprising a gate electrode of $n^+$ —polysilicon 18, $n^+$ —Si 19, p-Si 22, $p^+$ —Si 21, and $SiO_2$ 17 is provided along with a ground conductor 12 and an input terminal 24 of an A/D converter, and on the back surface of the p-Si substrate, a back surface metal 16 is provided to be connected to a metal block (not shown).

Figure 3:
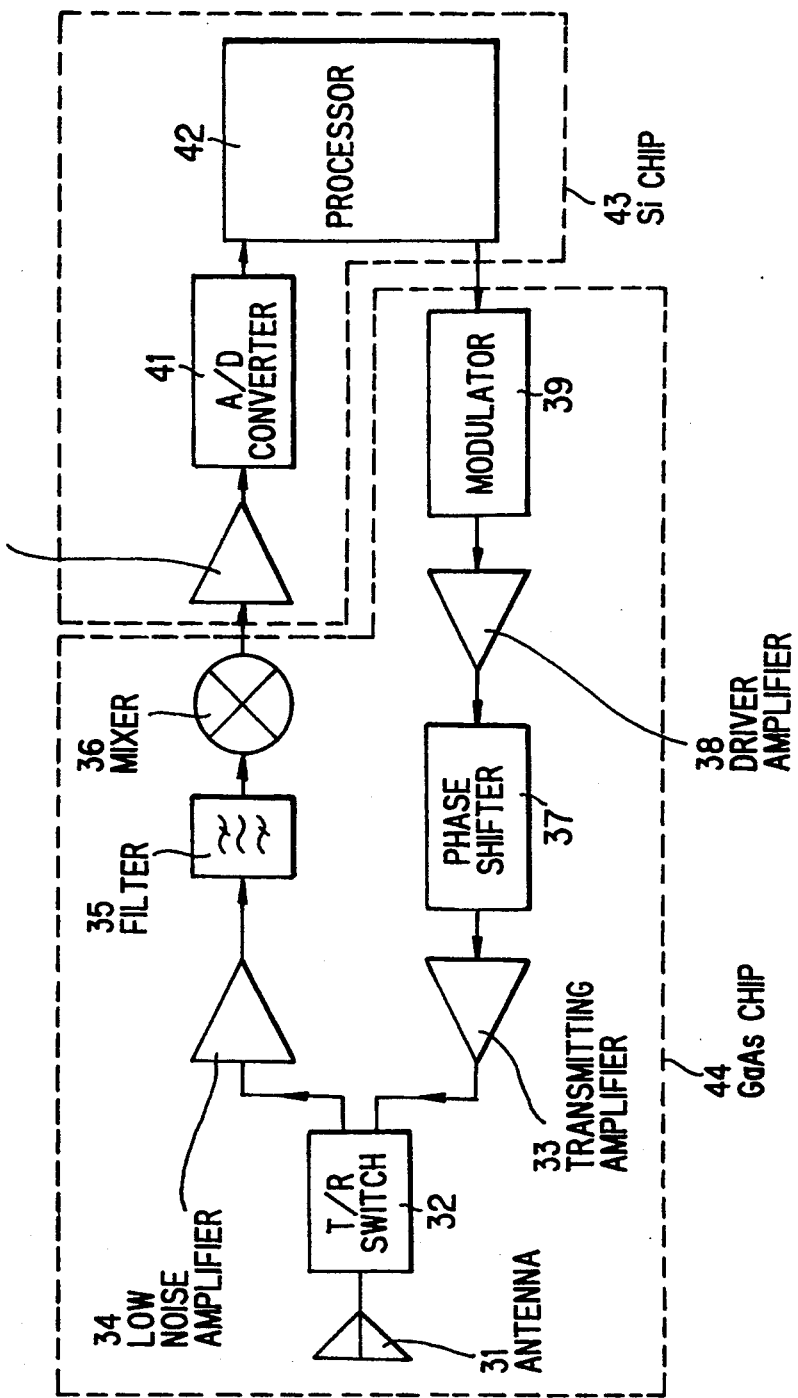
FIG. 3 is a block diagram showing the microwave.millimeter wave transmitting and receiving module of the preferred embodiment.

FIG. 3 shows an electric circuit of a microwave.millimeter wave transmitting and receiving module comprising blocks of the Si chip 43 and the GaAs chip 44. In the Si chip 43, an intermediate amplifier 40, an A/D converter 41 and a processor 42 are provided, and, in the GaAs chip 44, an antenna 31, a transmitting and receiving switch 32, a low noise amplifier 34, a filter 35, a mixer 36, a transmitting amplifier 33, a phase shifter 37, a driver amplifier 38, and a modulator 39 are provided.

Figure 4:
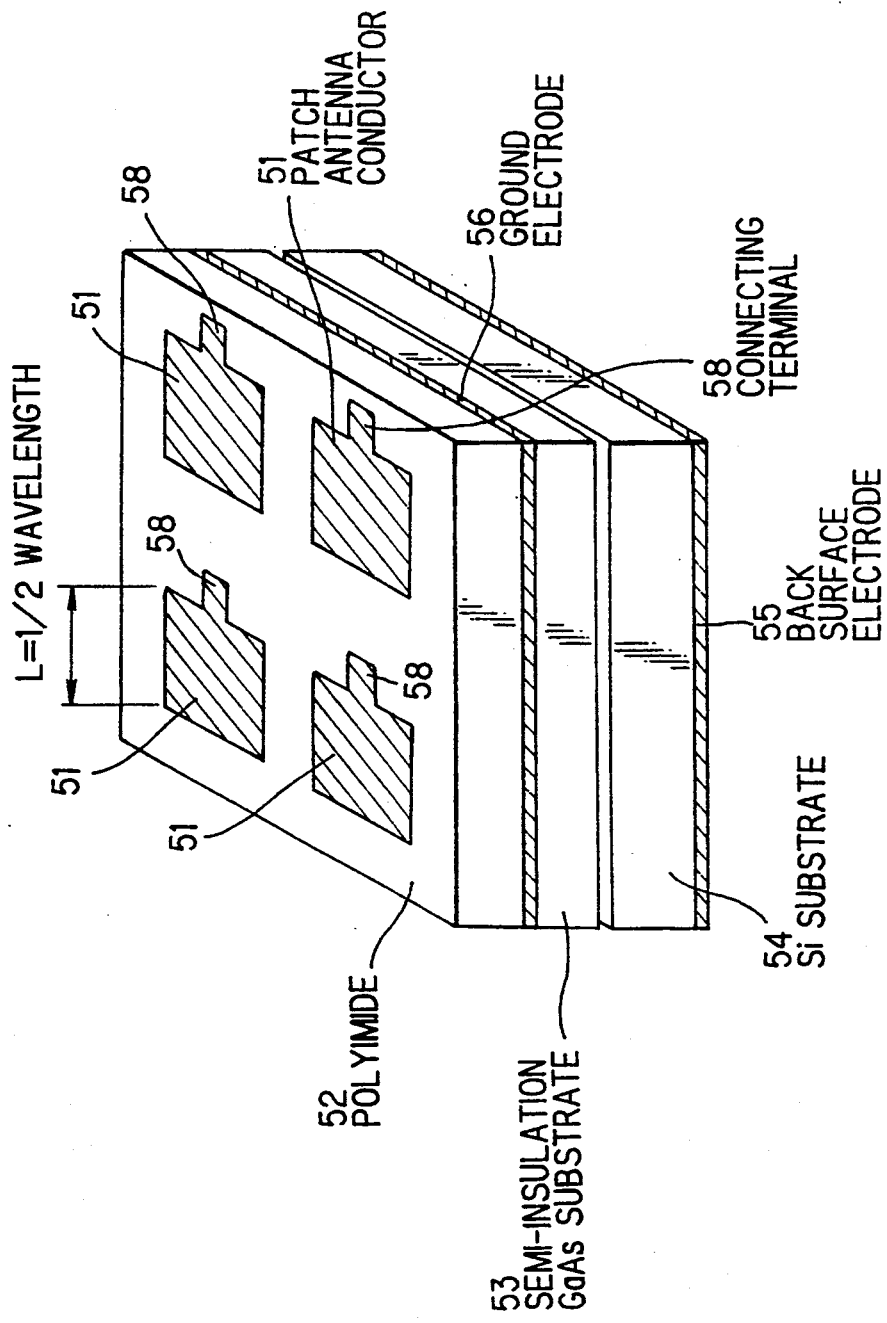
FIG. 4 is a perspective view showing the microwave.millimeter wave transmitting and receiving module of the preferred embodiment applied to an active phased array antenna.

FIG. 4 shows an active phased array antenna to which the microwave.millimeter wave transmitting and receiving module of the invention is applied. The active phased array antenna comprises a semi-insulation GaAs substrate 53 provided with a ground electrode 56, and a Si substrate 54 provided with a back surface electrode 55, wherein a microwave.millimeter wave active circuit 55 is provided on the main plane of the GaAs substrate 53, and a signal processing circuit is provided on the main plane of the Si substrate 54. In this active phased array antenna, antenna patch conductors 51 are provided on a polyimide layer 52 which is provided on the ground electrode 56. Each of the antenna patch conductors 51 has an antenna connecting terminal 58 which is connected through a via-hole to the microwave.millimeter wave active circuit provided on the main plane of the semi-insulation GaAs substrate 53.

As described above, antennas and a microwave.millimeter wave circuit which are of a small integration scale, and are required to be provided on a semi-insulation substrate are provided on the main plane of a semi-insulation GaAs substrate, and a signal processing circuit such as an A/D converter which is of a large integration scale is provided on the main plane of a Si substrate, wherein the both main planes of the semi-insulation substrate and the Si substrate are directly contacted (bonded). Consequently, a microwave.millimeter wave transmitting and receiving module having antennas is obtained with high yield by only one contacting (bonding) process.

In the preferred embodiment, although GaAs is adopted for a compound semiconductor substrate, other compound semiconductor substrates such as InP, etc. may be used, and, although a heterojunction bipolar transistor (HBT) is used, HEMT, GaAs FET, MISFET, etc. may be used. Further, an active device provided on a Si substrate is not limited to an n-MOS transistor, but a p-MOS transistor, a bipolar transistor, an Si system HBT, a hybrid circuit such as a BiCMOS, etc. may be used. Still further, polyimide for providing antennas may be replaced by other dielectrics.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A microwave.millimeter wave transmitting and receiving module, comprising:
a first semiconductor chip comprising a microwave.millimeter wave circuit provided on a first plane of a semi-insulation compound semiconductor substrate, and a ground metal film provided on a second plane of said semi-insulation compound semiconductor substrate, said microwave.millimeter wave circuit comprising compound semiconductor active and passive devices; and
an antenna conductor provided on the second plane of said semi-insulation compound semiconductor substrate;
wherein said antenna conductor is connected through a via-hole to said active device of said microwave.millimeter wave circuit;
a second semiconductor chip comprising a signal processing circuit provided on a main plane of a silicon substrate;
wherein said first and second semiconductor chips are in contact with each other on said first plane of said semi-insulation compound semiconductor substrate and said main plane of said silicon substrate.

2. A microwave.millimeter wave transmitting and receiving module, according to claim 1, wherein:
said microwave.millimeter wave circuit provided on said semi-insulation compound semiconductor substrate, comprises:
at least a low noise amplifier, a mixer, a modulator, and a high output amplifier; and
said signal processing circuit provided on said silicon substrate, comprises:
at least an analog to digital converter.

3. A microwave.millimeter wave transmitting and receiving module, according to claim 1, wherein:
said semi-insulation compound semiconductor substrate is a semi-insulation GaAs semiconductor substrate.

4. A microwave.millimeter wave transmitting and receiving module, according to claim 1, wherein:
said antenna conductor comprises a plurality of antenna patch conductors each having a connecting terminal to provide an active phased array antenna, said connecting terminal being connected through said via-hole to said active device of said microwave.millimeter wave circuit.

5. A microwave.millimeter wave transmitting and receiving module, comprising:
a semi-insulation GaAs substrate, and a silicon substrate, said GaAs and silicon substrates being closely faced by respective main planes;
a microwave.millimeter wave transmitting and receiving circuit, provided on said main plane of said GaAs substrate, said microwave.millimeter wave transmitting and receiving circuit being implemented with bipolar transistor circuitry;
a microstrip antenna connected to said microwave.millimeter wave transmitting and receiving circuit, said microstrip antenna being provided on a plane opposite to said main plane of said GaAs substrate;
a signal processing circuit for processing signals supplied to and from said microwave.millimeter wave transmitting and receiving circuit, said signal processing circuit being provided on said main plane of said silicon substrate, and being implemented with MOS transistor circuitry; and
terminals for connecting said microwave.millimeter wave transmitting and receiving circuit and said signal processing circuit, said terminals being provided on said main planes of said GaAs and silicon substrates, respectively.

6. A microwave.millimeter wave transmitting and receiving module, according to claim 5, wherein:
said microwave.millimeter wave transmitting and receiving circuit comprises:

at least a low noise amplifier, a mixer, a modulator, a high output amplifier, a transmit/receive switch, and a phase shifter; and said signal processing circuit comprises:

at least an intermediate frequency amplifier, an analog to digital converter, and digital signal processing circuitry.

7. A microwave.millimeter wave transmitting and receiving module, according to claim 5, wherein:
   said signal processing circuit is implemented with large scale integration circuitry.

8. A microwave.millimeter wave transmitting and receiving module, according to claim 5, wherein:
   said main planes of said GaAs and silicon substrates are in direct contact with each other.

* * * * *

UNITED STATES PATENT AND TRADEMARK OFFICE
CERTIFICATE OF CORRECTION

PATENT NO. : 5,404,581
DATED : April 4, 1995
INVENTOR(S) : Kazuhiko Honjo

It is certified that error appears in the above-identified patent and that said Letters Patent is hereby corrected as shown below:

Column 1, lines 17 and 18, after "antenna", delete "been intensively carried out. A".

Signed and Sealed this

Ninth Day of April, 1996

Attest:

BRUCE LEHMAN

Attesting Officer    Commissioner of Patents and Trademarks